(12) United States Patent
Arai et al.

(10) Patent No.: US 9,401,283 B2
(45) Date of Patent: Jul. 26, 2016

(54) SUBSTRATE TREATMENT METHOD

(71) Applicant: SCREEN Holdings Co., Ltd., Kyoto (JP)

(72) Inventors: Kenichiro Arai, Kyoto (JP); Kazunari Nada, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 14/803,576

(22) Filed: Jul. 20, 2015

(65) Prior Publication Data

US 2015/0325449 A1    Nov. 12, 2015

Related U.S. Application Data

(63) Continuation of application No. 12/363,066, filed on Jan. 30, 2009, now abandoned.

(30) Foreign Application Priority Data

| Jan. 31, 2008 | (JP) | ................................. 2008-021776 |
| Dec. 2, 2008 | (JP) | ................................. 2008-307995 |

(51) Int. Cl.
| H01L 21/306 | (2006.01) |
| H01L 21/687 | (2006.01) |
| H01L 21/67 | (2006.01) |

(52) U.S. Cl.
CPC ...... *H01L 21/30604* (2013.01); *H01L 21/6708* (2013.01); *H01L 21/67051* (2013.01); *H01L 21/68742* (2013.01); *H01L 21/68764* (2013.01)

(58) Field of Classification Search
None
See application file for complete search history.

(56) References Cited

U.S. PATENT DOCUMENTS

| 4,856,766 A | 8/1989 | Huberts ........................... 269/21 |
| 5,474,644 A | 12/1995 | Kato et al. ..................... 156/345 |
| 5,870,271 A | 2/1999 | Herchen ....................... 361/234 |
| 6,012,858 A * | 1/2000 | Konishi .................. B05C 11/08 118/52 |
| 6,528,128 B2 * | 3/2003 | Ito ........................... B05C 5/002 427/240 |
| 6,709,174 B2 * | 3/2004 | Yamamoto ............ B05C 5/0208 118/52 |
| 6,733,616 B2 | 5/2004 | Hu et al. .................. 156/345.23 |
| 6,771,482 B2 | 8/2004 | Kenny .......................... 361/234 |

(Continued)

FOREIGN PATENT DOCUMENTS

| CN | 100405554 | 7/2008 |
| JP | 61-043431 | 3/1986 |

(Continued)

OTHER PUBLICATIONS

Office Action issued Mar. 24, 2010 in connection with corresponding Chinese Patent Application No. 200910009604.1.

(Continued)

*Primary Examiner* — Allan Olsen
(74) *Attorney, Agent, or Firm* — Ostrolenk Faber LLP

(57) ABSTRACT

A substrate treatment method includes the steps of: supporting a substrate with a support member; arranging an extension surface such that the extension surface laterally surrounds one major surface of the substrate supported by the support member and extends continuously to the major surface of the substrate supported by the support member; rotating the substrate supported by the support member; and etching the substrate by supplying an etching liquid onto the major surface of the substrate supported by the support member, wherein the extension surface has higher affinity for the etching liquid than the major surface of the substrate supported by the support member.

9 Claims, 10 Drawing Sheets

(56) References Cited

U.S. PATENT DOCUMENTS

| | | | |
|---|---|---|---|
| 6,786,996 B2* | 9/2004 | Emami | H01L 21/6708 156/345.1 |
| 6,793,965 B2 | 9/2004 | Chen et al. | 427/248.1 |
| 7,195,679 B2* | 3/2007 | Xia | B08B 3/02 134/147 |
| 7,419,316 B2* | 9/2008 | Kitamura | G06F 7/3021 396/611 |
| 7,799,695 B2* | 9/2010 | Engesser | H01L 21/67075 134/33 |
| 7,819,594 B2* | 10/2010 | Funakoshi | G03F 7/3021 118/300 |
| 2002/0166633 A1* | 11/2002 | Ryu | H01L 21/67086 156/345.18 |
| 2004/0180142 A1 | 9/2004 | Kobayashi et al. | 427/240 |
| 2006/0292887 A1 | 12/2006 | Hara | 438/753 |
| 2009/0194234 A1 | 8/2009 | Arai et al. | 156/345.23 |
| 2010/0029088 A1* | 2/2010 | Mayer | C23F 1/08 438/748 |
| 2013/0048610 A1* | 2/2013 | Goodman | B44C 1/22 216/83 |
| 2014/0174657 A1* | 6/2014 | Tasaka | H01L 21/67051 156/345.23 |

FOREIGN PATENT DOCUMENTS

| | | |
|---|---|---|
| JP | 6-84881 | 3/1994 |
| JP | 6-273919 | 9/1994 |
| JP | 7-45583 | 2/1995 |
| JP | 7-221062 | 8/1995 |
| JP | 8-60384 | 3/1996 |
| JP | 8-139065 | 5/1996 |
| JP | 9-314022 | 12/1997 |
| JP | 11-176787 | 7/1999 |
| JP | 2002-305132 | 10/2002 |
| JP | 2004-273846 | 9/2004 |
| JP | 2007-88381 | 4/2007 |

OTHER PUBLICATIONS

Korean Office Action issued Nov. 9, 2010 in connection with corresponding Korean Patent Application No. 10-2009-0005330.

Office Action issued Sep. 21, 2011 in related U.S. Appl. No. 12/362,945 of Kazunari Nada et al., filed Jan. 30, 2009, which includes at pp. 2-4, a nonstatutory obviousness-type double patenting rejection over certain claims of the present application.

\* cited by examiner

FIG. 12

SUBSTRATE TREATMENT METHOD

CROSS-REFERENCE TO RELATED APPLICATIONS

This application is a continuation of U.S. patent application Ser. No. 12/363,066, filed Jan. 30, 2009, which claims the benefit of Japanese Patent Application Nos. 2008-021776 and 2008-307995, filed Jan. 31, 2008 and Dec. 2, 2008, respectively, incorporated herein by reference.

BACKGROUND OF THE INVENTION

1. Field of the Invention

The present invention relates to a substrate treatment apparatus which performs an etching treatment to etch a major surface of a substrate with an etching liquid, and to a substrate support to be used for the apparatus. Examples of the substrate to be subjected to the etching treatment include semiconductor wafers, glass substrates for liquid crystal display devices, glass substrates for plasma display devices, substrates for FED (Field Emission Display) devices, substrates for optical disks, substrates for magnetic disks, substrates for magneto-optical disks, and substrates for photo masks.

2. Description of Related Art

In semiconductor device production processes, a liquid treatment is often performed to treat a semiconductor wafer (hereinafter referred to simply as "wafer") with a treatment liquid. An exemplary liquid treatment is an etching treatment which is performed by supplying an etching liquid to a major surface of the wafer. Examples of the etching treatment as herein defined include an etching treatment for patterning the major surface of the wafer (the wafer per se or a thin film formed on the wafer), and a cleaning treatment for removing foreign matter from the major surface of the wafer by utilizing an etching effect.

A substrate treatment apparatus for treating the major surface of the wafer with the treatment liquid is of a batch treatment type which is adapted to treat a plurality of wafers at a time, or of a single substrate treatment type which is adapted to treat a single wafer at a time. The substrate treatment apparatus of the single substrate treatment type includes, for example, a spin chuck which generally horizontally holds and rotates the wafer, a treatment liquid nozzle which supplies the treatment liquid toward the major surface of the wafer held by the spin chuck, and a nozzle movement mechanism which moves the treatment liquid nozzle above the wafer.

Where it is desired to perform the etching treatment on a device formation surface of the wafer to be formed with a device, for example, the wafer is held by the spin chuck with the device formation surface thereof facing up. Then, the etching liquid is spouted from the treatment liquid nozzle onto an upper surface of the wafer rotated by the spin chuck, while the treatment liquid nozzle is moved by the nozzle movement mechanism. As the treatment liquid nozzle is moved, a liquid application point at which the etching liquid is applied on the upper surface of the wafer is moved. The etching liquid spreads over the entire upper surface of the wafer by scanning the liquid application point between a rotation center and a peripheral edge of the wafer on the upper surface of the wafer (see, for example, Japanese Unexamined Patent Publication No. 2007-88381).

However, the etching liquid supplied to a center portion of the upper surface of the wafer receives a centrifugal force generated by the rotation of the wafer to be thereby moved radially outward on the upper surface of the wafer. Therefore, a peripheral portion of the upper surface of the wafer is subjected to an excess amount of the etching liquid which includes the etching liquid directly supplied thereto from the treatment liquid nozzle and the etching liquid moved thereto from the center portion of the upper surface. Thus, the peripheral portion of the upper surface of the wafer is etched at a higher etching rate than the center portion, resulting in uneven treatment of the upper surface of the wafer.

The inventors of the present invention have conducted studies on a wafer thinning process to be performed through the etching treatment by the substrate treatment apparatus of the single substrate treatment type. More specifically, with a back surface (a non-device formation surface formed with no device) of the wafer facing up, hydrofluoric/nitric acid (a mixture of hydrofluoric acid and nitric acid) having a higher etching power is supplied as the etching liquid to the back surface (upper surface) of the wafer. A surface wafer material of the back surface of the wafer is etched away with hydrofluoric/nitric acid, whereby the wafer is thinned.

The inventors of the present invention found that a difference in etching rate between the peripheral portion and the center portion of the upper surface of the wafer increases as the rotation speed of the wafer is increased during the etching treatment. Further, the inventors found that, where the wafer is rotated at a predetermined low rotation speed (40 to 60 rpm), the difference in etching rate between the peripheral portion and the center portion is reduced to improve the in-plane uniformity of the etching treatment.

If the wafer is rotated at such a low rotation speed, however, a smaller centrifugal force acts on the etching liquid on the upper surface of the wafer, making it difficult to spin out the etching liquid moved to the peripheral portion of the upper surface of the wafer. Therefore, the etching liquid is liable to remain on the peripheral portion of the upper surface of the wafer to form a thick etching liquid film (liquid puddle) on the peripheral portion. The thick liquid film contains a deactivated etching liquid in a higher proportion and, hence, has a lower etching power. In addition, the thick liquid film removes heat from the peripheral portion of the wafer, thereby reducing the temperature of the peripheral portion of the upper surface of the wafer. As a result, the etching rate is reduced on the peripheral portion of the upper surface of the wafer. Therefore, it is necessary to increase the etching rate on the peripheral portion of the wafer to further improve the in-plane uniformity of the etching treatment.

Particularly, where the etching treatment is performed on a hydrophobic wafer such as a silicon wafer which has lower affinity for the etching liquid, the liquid film (liquid puddle) formed on the peripheral portion of the upper surface of the wafer has a greater thickness, so that the etching rate is drastically reduced on the peripheral portion of the upper surface of the wafer.

SUMMARY OF THE INVENTION

It is an object of the present invention to provide a substrate treatment apparatus which is capable of uniformly performing an etching treatment on a major surface of a substrate while substantially preventing an etching liquid from remaining on the major surface of the substrate.

It is another object of the present invention to provide a substrate support which substantially prevents an etching liquid from remaining on a major surface of a substrate, thereby ensuring a more uniform etching treatment.

A substrate treatment apparatus according to the present invention includes a substrate holding mechanism including a support member which supports a substrate, and an extension surface which laterally surrounds one major surface of the substrate supported by the support member and extends continuously to the major surface of the substrate, a rotation mechanism which rotates the substrate holding mechanism, and an etching liquid supply mechanism which supplies an etching liquid onto the major surface of the substrate held by the substrate holding mechanism.

An expression that the extension surface of the substrate holding mechanism extends continuously to the major surface of the substrate herein means that the extension surface is disposed in adjoining relation to the major surface of the substrate so that etching liquid present on the major surface of the substrate and etching liquid present on the extension surface form a continuous liquid film.

With this arrangement, the etching liquid supplied to the major surface of the substrate spreads over the major surface of the substrate and the extension surface of the substrate holding mechanism, whereby the liquid film is formed over the major surface of the substrate and the extension surface of the substrate holding mechanism. Since the extension surface of the substrate holding mechanism extends continuously to the major surface of the substrate, the etching liquid present on the major surface of the substrate and the etching liquid present on the extension surface of the substrate holding mechanism are continuous in the form of the liquid film. Therefore, the etching liquid does not remain on a peripheral portion of the major surface of the substrate, but smoothly moves to the extension surface of the substrate holding mechanism. Thus, the liquid film of the etching liquid is formed as having a uniform and smaller thickness over the entire major surface of the substrate. This substantially prevents the etching liquid from remaining on the peripheral portion of the major surface of the substrate, thereby suppressing or preventing reduction in etching rate on the peripheral portion. Therefore, the etching treatment is performed on the major surface of the substrate with improved in-plane uniformity.

The extension surface preferably has higher affinity for the etching liquid than the major surface of the substrate supported by the support member. In this case, the movement of the etching liquid from the major surface of the substrate to the extension surface of the substrate holding mechanism is efficiently promoted. Therefore, the etching liquid supplied onto the major surface of the substrate is smoothly moved toward the extension surface of the substrate holding mechanism. As a result, the liquid film of the etching liquid formed on the major surface of the substrate has a more uniform and smaller thickness. Therefore, the etching treatment is performed with further improved in-plane uniformity.

The substrate holding mechanism may include a substrate support, and a base member which supports the substrate support. The substrate support may include the support member and the extension surface. The rotation mechanism may include a base member rotating mechanism which rotates the base member together with the substrate support.

With this arrangement, the etching liquid supplied to the major surface of the substrate spreads over the major surface of the substrate and the extension surface of the substrate support, whereby the continuous liquid film is formed over the major surface of the substrate and the extension surface of the substrate support. Thus, the liquid film of the etching liquid is formed as having a generally uniform and smaller thickness over the entire major surface of the substrate held by the support member. Therefore, the etching treatment is performed on the major surface of the substrate with improved in-plane uniformity.

Alternatively, the substrate holding mechanism may include a base member which includes the support member and the extension surface, and the rotation mechanism may include a base member rotating mechanism which rotates the base member.

With this arrangement, the etching liquid supplied to the major surface of the substrate spreads over the major surface of the substrate and the extension surface of the base member, whereby the continuous liquid film is formed over the major surface of the substrate and the extension surface of the base member. Thus, the liquid film of the etching liquid is formed as having a generally uniform and smaller thickness over the entire major surface of the substrate held by the support member. Therefore, the etching treatment is performed on the major surface of the substrate with improved in-plane uniformity.

The support member horizontally supports the substrate, and is preferably configured such that the major surface of the substrate supported by the support member is located at a higher level than the extension surface.

With this arrangement, the major surface of the substrate (to be treated) is located at a higher level than the extension surface, so that the movement of the etching liquid from the major surface of the substrate to the extension surface of the substrate holding mechanism is not hindered. Therefore, the etching liquid supplied onto the major surface of the substrate is smoothly moved toward the extension surface of the substrate holding mechanism.

The support member is preferably configured such that, even after the substrate supported by the support member is treated with the etching liquid, the major surface of the substrate is located at a higher level than the extension surface. In this case, even if the height level of the major surface of the substrate is reduced by the etching treatment, the height level of the major surface of the substrate is kept higher than that of the extension surface until the completion of the etching treatment. Therefore, the etching liquid supplied onto the major surface of the substrate is smoothly moved toward the extension surface of the substrate holding mechanism during the entire etching treatment period.

The support member horizontally supports the substrate, and the substrate holding mechanism may further include a taper surface extending continuously from the extension surface radially outward of the substrate and having a height that progressively decreases in a direction extending radially outward of the substrate.

With this arrangement, the taper surface extends continuously from the extension surface radially outward of the substrate. Since the gravity acts on etching liquid present on the taper surface, the etching liquid flows at a higher flow rate on the extension surface. Therefore, the movement of the etching liquid from the upper surface of the substrate to the extension surface of the substrate holding mechanism is promoted. As a result, the liquid film of the etching liquid formed on the major surface of the substrate has a reduced thickness. This efficiently prevents the etching liquid from remaining on the major surface of the substrate.

The etching liquid supply mechanism preferably scans over the entire major surface of the substrate rotated by the rotation mechanism to supply the etching liquid to the major surface of the substrate. This makes it possible to directly supply the etching liquid to the entire major surface of the substrate. Therefore, even if hydrofluoric/nitric acid which is easily deactivated after having used its etching power is employed as the etching liquid, the etching rate can be kept uniform over the entire major surface of the substrate.

In this case, the etching liquid supply mechanism preferably scans to a position radially outward of the peripheral portion of the substrate rotated by the rotation mechanism over the major surface of the substrate. Thus, the etching liquid is supplied directly to a boundary between the major surface of the substrate and the extension surface from the etching liquid supply mechanism, so that the continuous liquid film is easily formed over the major surface of the substrate and the extension surface. Therefore, the liquid film of the etching liquid formed on the major surface of the substrate has a further more uniform thickness. Thus, the etching treatment can be performed with further improved in-plane uniformity.

A substrate support according to the present invention is adapted to support a substrate, and used in a substrate treatment apparatus which treats the substrate with an etching liquid. The substrate support includes a support member which supports the substrate, and an extension surface which laterally surrounds one major surface of the substrate supported by the support member and extends continuously to the major surface of the substrate.

With this arrangement, the etching liquid supplied to the major surface of the substrate spreads over the major surface of the substrate and the extension surface of the substrate support, whereby the continuous liquid film is formed over the major surface of the substrate and the extension surface of the substrate support. Thus, the liquid film of the etching liquid is formed as having a uniform and smaller thickness over the entire major surface of the substrate held by the support member. Therefore, the etching treatment is performed on the major surface of the substrate with improved in-plane uniformity.

The foregoing and other objects, features and effects of the present invention will become more apparent from the following detailed description of the preferred embodiments with reference to the attached drawings.

BRIEF DESCRIPTION OF THE DRAWINGS

FIG. 12 is a sectional view schematically showing the construction of a substrate treatment apparatus according to a fourth embodiment of the present invention.

DETAILED DESCRIPTION OF PREFERRED EMBODIMENTS

Figure 1:
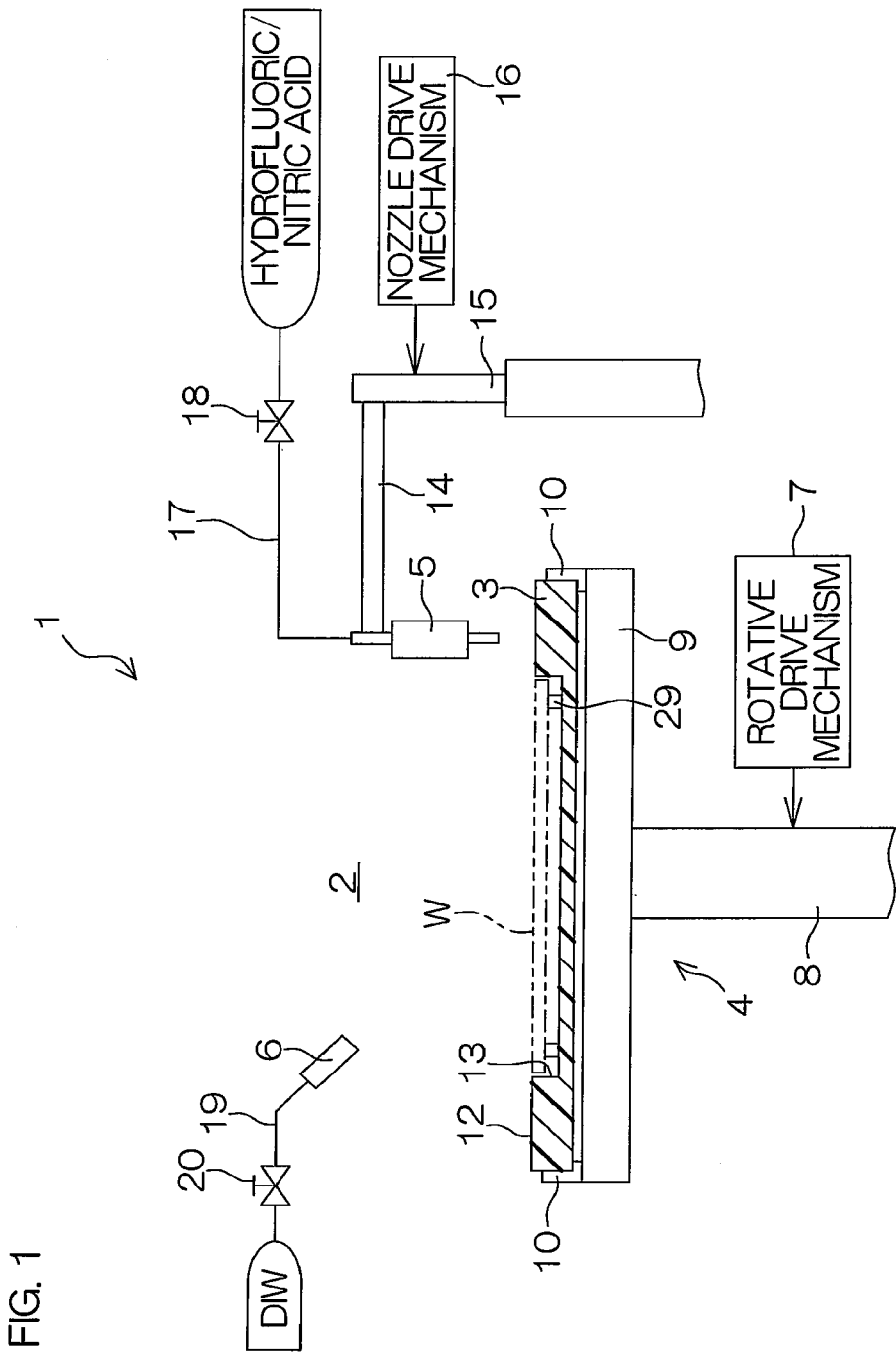
FIG. 1 is a sectional view schematically showing the construction of a substrate treatment apparatus according to a first embodiment of the present invention.

FIG. 1 is a sectional view schematically showing the construction of a substrate treatment apparatus 1 according to one embodiment (first embodiment) of the present invention.

The substrate treatment apparatus 1 is of a single substrate treatment type which performs an etching treatment on a back surface (non-device formation surface) opposite from a front surface (device formation surface) of a round wafer W such as a silicon wafer for thinning the wafer W. In this embodiment, hydrofluoric/nitric acid (a mixture of hydrofluoric acid and nitric acid) is used as an etching liquid.

The substrate treatment apparatus 1 includes a substrate support (susceptor) 3 which generally horizontally holds the wafer W with the back surface of the wafer W facing up, a spin chuck 4 which supports the substrate support 3 and serves for rotating the wafer W and the substrate support 3 about a vertical axis extending through the center of the wafer W, a hydrofluoric/nitric acid nozzle 5 which serves as an etching liquid supply mechanism for supplying hydrofluoric/nitric acid onto the upper surface of the wafer W held by the substrate support 3, and a DIW nozzle 6 which supplies DIW (deionized water) as a rinse liquid toward the upper surface of the wafer W held by the substrate support 3. These components are disposed in a treatment chamber 2 defined by a partition wall (not shown). The substrate holding mechanism consists of the substrate support 3 and the spin chuck 4.

The spin chuck 4 includes a disk-shaped spin base 9 fixed to an upper end of a rotation shaft 8 which is rotated about a vertical axis by a rotative drive force of a rotative drive mechanism (a base member rotating mechanism) 7 such as a motor, and a plurality of holder members 10 disposed generally equidistantly circumferentially of the spin base 9 as a base member for holding the substrate support 3 so as to horizontally hold the wafer W. Thus, the spin chuck 4 generally horizontally holds the wafer W and rotates the wafer W by rotating the rotation shaft 8 by the rotative drive fore of the rotative drive mechanism 7 with the substrate support 3 being held by the plurality of holder members 10.

The substrate support 3 has a disk shape having a smaller diameter than the spin base 9. The substrate support 3 has a hollow cylindrical accommodation recess (a support member) 13 provided in a center portion of an upper surface thereof for accommodating the wafer W. The upper surface of the substrate support 3 has a first annular flat surface 12 which surrounds the accommodating recess 13.

The hydrofluoric/nitric acid nozzle 5 is, for example, a straight nozzle which spouts hydrofluoric/nitric acid in the form of a continuous stream. The hydrofluoric/nitric acid nozzle 5 is attached to an arm 14 which generally horizontally extends above the spin chuck 4. The arm 14 is supported by an arm support shaft 15 generally vertically extending on a lateral side of the spin chuck 4. A nozzle drive mechanism 16 is connected to the arm support shaft 15, which is rotated by a drive force of the nozzle drive mechanism 16 to pivot the arm 14.

A hydrofluoric/nitric acid supply pipe 17 is connected to the hydrofluoric/nitric acid nozzle 5. Hydrofluoric/nitric acid is supplied from a hydrofluoric/nitric acid supply source to the hydrofluoric/nitric acid supply pipe 17. A hydrofluoric/nitric acid valve 18 is provided in the hydrofluoric/nitric acid supply pipe 17 for switchably permitting and prohibiting the supply of hydrofluoric/nitric acid to the hydrofluoric/nitric acid nozzle 5.

The DIW nozzle 6 is, for example, a straight nozzle which spouts DIW in the form of a continuous stream. The DIW nozzle 6 is disposed above the spin chuck 4 with its spout directing toward a center portion of the wafer W. A DIW supply pipe 19 is connected to the DIW nozzle 6. DIW is supplied from a DIW supply source through the DIW supply pipe 19. A DIW valve 20 is provided in the DIW supply pipe 19 for switchably permitting and prohibiting the supply of DIW to the DIW nozzle 6.

Figure 2A:
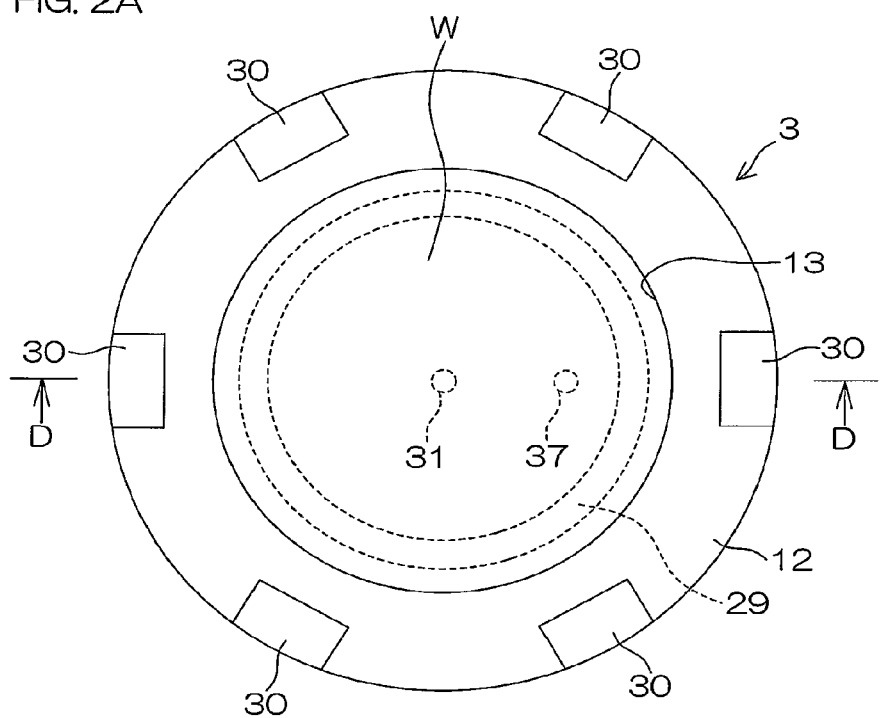
FIG. 2A is a plan view showing the structure of a susceptor of the substrate treatment apparatus shown in FIG. 1.
Figure 2B:
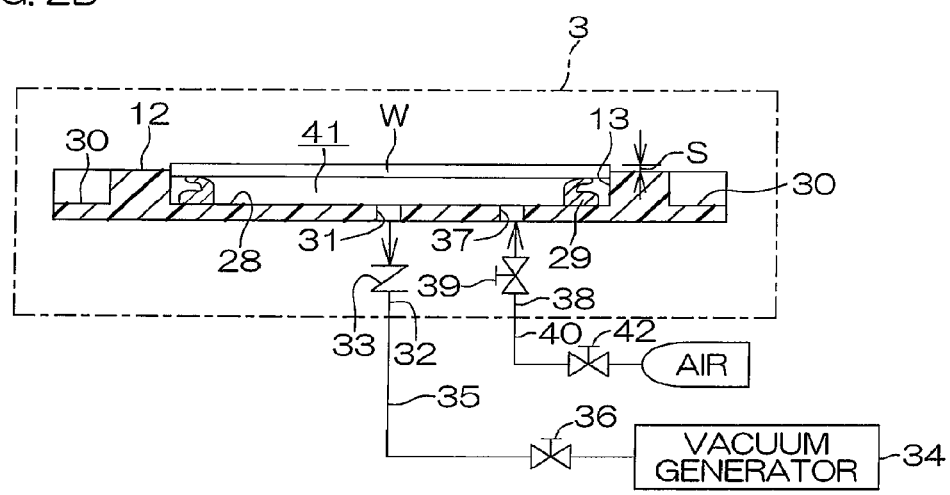
FIG. 2B is a sectional view taken along a section line D-D in FIG. 2A.

FIG. 2A is a plan view showing the structure of the substrate support 3, and FIG. 2B is a sectional view taken along a section line D-D in FIG. 2A.

The substrate support 3 is formed of a material (resin material) such as polyvinyl chloride which is resistant to hydrofluoric/nitric acid.

The accommodation recess 13 has a round bottom surface, and an inner peripheral surface vertically extending upright from a peripheral edge of the bottom surface. The inner peripheral surface is a cylindrical surface having substantially the same diameter as the wafer W. An annular seal member 29 serving as a support member for supporting the wafer W is provided along the peripheral edge of the bottom 28 of the accommodation recess 13 on an upper surface (bottom surface) of the bottom 28. A peripheral portion of the lower surface of the wafer W is supported by the seal member 29. As shown in FIG. 2B, the seal member 29 may be a lip packing which has a lip to be brought into line contact with the lower surface of the wafer W, or may be a surface packing which is to be brought into surface contact with the lower surface of the wafer W. Where the lip packing is used as the seal member 29, the lip packing has a sufficiently rigid proximal portion to limit its deformation and, therefore, precisely defines the height of the upper surface of the supported wafer W.

The first annular surface 12 of the substrate support 3 is a flat surface extending outward from an upper edge of the inner peripheral surface of the accommodation recess 13. With the wafer W being supported by the substrate support 3, the first annular surface 12 is parallel to the upper surface of the wafer W. The first annular surface 12 is located at a height level such that hydrofluoric/nitric acid present on the upper surface of the wafer W held in the accommodation recess 13 and hydrofluoric/nitric acid present on the first annular surface 12 forma continuous liquid film. More specifically, the first annular surface 12 is horizontally located at a height level that is lower than the upper surface of the wafer W (the wafer W subjected to the etching treatment) held in the accommodation recess 13. The height level of the first annular surface 12 of the substrate support 3 is such that a level difference S defined between the first annular surface 12 and the upper surface of the wafer W is, for example, about 200 µm before the etching treatment and is about 40 µm after the etching treatment. With the wafer W being held by the substrate support 3, the first annular surface 12 serves as an extension surface extending continuously to the upper surface of the wafer W. The first annular surface 12 is substantially equivalent to an extension surface provided by virtually expanding the upper surface of the wafer W to cause the liquid to flow outward from the upper surface of the wafer W.

The first annular surface 12 of the substrate support 3 has been subjected to a hydrophilizing process so as to be imparted with higher affinity for hydrofluoric/nitric acid (hydrophilic property). The hydrophilizing process may be, for example, a sand blast process (surface roughening process). The hydrophilizing process causes the first annular surface 12 of the substrate support 3 to have higher affinity for hydrofluoric/nitric acid than the upper surface (back surface) of the wafer W.

The substrate support 3 has a plurality of engagement recesses 30 generally equidistantly provided on a peripheral portion of the first annular surface 12 thereof. The engagement recesses 30 are disposed in association with the respective holder members 10. With the holder members 10 in engagement with the respective engagement recesses 30, the substrate support 3 is fixed to the spin chuck 4.

The accommodation recess 13 has a suction port 31 formed in the bottom 28 thereof. A first suction pipe 32 is connected to the suction port 31 at one end thereof. A check valve 33 is provided in the first suction pipe 32. The check valve 33 permits passage of air sucked from the suction port 31 into a vacuum generator 34, and prevents reverse flow of the air. One end of a second suction pipe 35 is connectable to the other end of the first suction pipe 32. The other end of the second suction pipe 35 is connected to the vacuum generator 34 which serves as a suction mechanism. A suction valve 36 is provided in the second suction pipe 35 for switchably opening and closing the second suction pipe 35.

The accommodation recess 13 further has a vacuum relief port 37 formed in the bottom 28 thereof. A first air supply pipe 38 is connected to the relief port 37 at one end thereof. A relief valve 39 for opening and closing the first air supply pipe 38 is provided in the first air supply pipe 38. One end of a second air supply pipe 40 is connectable to the other end of the first air supply pipe 38. An air supply source is connected to the other end of the second air supply pipe 40, so that air can be supplied from the air supply source to the first air supply pipe 38 through the second air supply pipe 40. A switch valve 42 for opening and closing the second air supply pipe 40 is provided in the second air supply pipe 40. Among the aforementioned pipes and valves, the first suction pipe 32, the check valve 33, the first air supply pipe 38 and the relief valve 39 are attached to the substrate support 3.

When the relief valve 39 is closed and the suction valve 36 is opened with the vacuum generator 34 being active, with the wafer W being accommodated in the accommodation recess 13 and with the one end of the second suction pipe 35 being connected to the other end of the first suction pipe 32, air is sucked from a space 41 defined between the bottom 28 and the wafer W. Thus, the internal pressure of the space 41 is reduced to a negative level, whereby the lower surface (device formation surface) of the wafer W is held by suction. Even if the suction valve 36 is thereafter closed and the first suction pipe 32 is disconnected from the second suction pipe 35, the check valve 33 and the closed relief valve 39 prevent air from flowing into the space 41. Thus, the lower surface of the wafer W is continuously held by suction. With the wafer W being held by suction, the peripheral portion of the lower surface of the wafer W is kept in intimate contact with an upper portion of the seal member 29, whereby hydrofluoric/nitric acid is prevented from intruding into the lower surface (device formation region) of the wafer W.

When the relief valve 39 and the switch valve 42 are opened with the one end of the second air supply pipe 40 being connected to the other end of the first air supply pipe 38 and with the wafer W being held on the substrate support 3 by suction, high pressure air is supplied into the space 41 defined between the bottom 28 and the wafer W, and the vacuum is relieved in the space 41. Thus, the wafer W is released from the suction holding, so that the wafer W can be detached from the substrate support 3.

Figure 3:
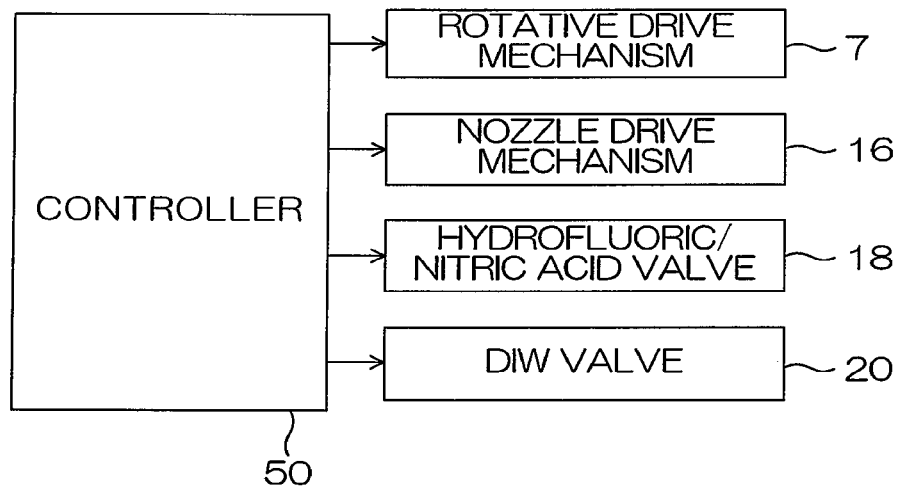
FIG. 3 is a block diagram showing the electrical construction of the substrate treatment apparatus shown in FIG. 1.

FIG. 3 is a block diagram showing the electrical construction of the substrate treatment apparatus 1.

The substrate treatment apparatus 1 includes a controller 50 including a microcomputer.

The rotative drive mechanism 7, the nozzle drive mechanism 16, the hydrofluoric/nitric acid valve 18, the DIW valve 20 and the like are connected as control objects to the controller 50.

Figure 4:
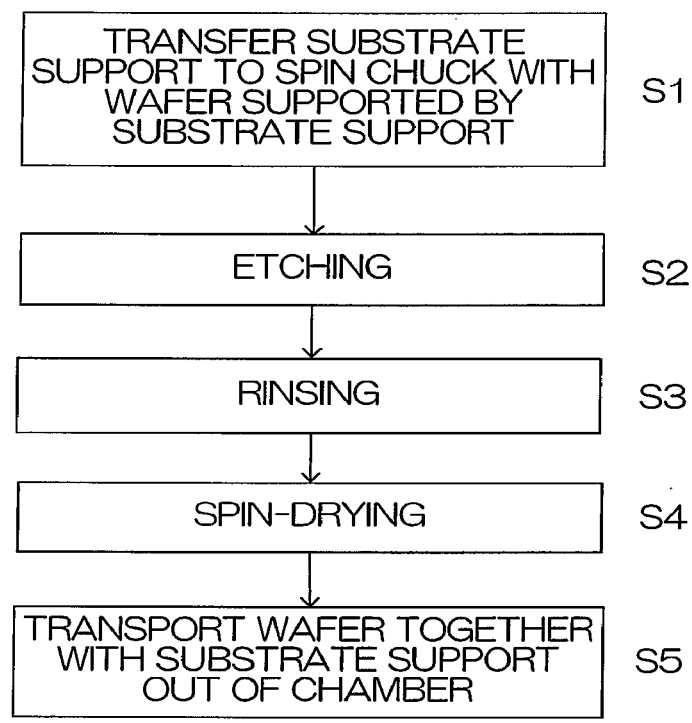
FIG. 4 is a flow chart showing an exemplary wafer treatment to be performed by the substrate treatment apparatus shown in FIG. 1.
Figure 5:
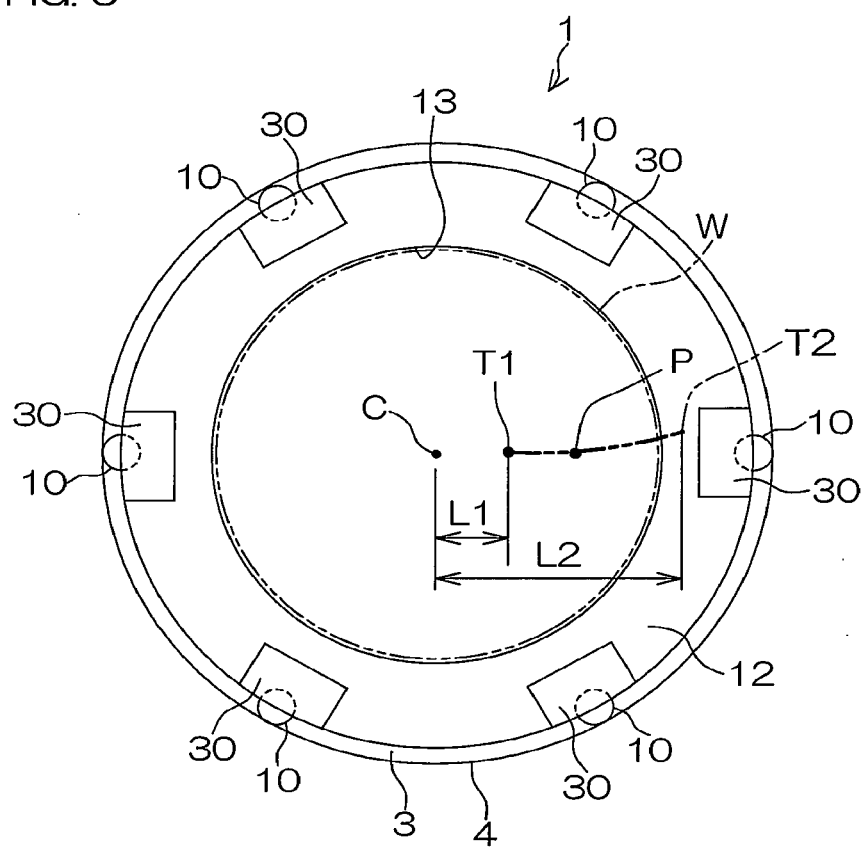
FIG. 5 is a schematic plan view for explaining a movement path of a hydrofluoric/nitric acid application point over an upper surface of a wafer and an upper surface of the susceptor.

FIG. 4 is a flow chart showing an exemplary wafer treatment to be performed by the substrate treatment apparatus 1. FIG. 5 is a schematic plan view for explaining a movement path of a hydrofluoric/nitric acid application point P over the upper surface of the wafer W and the first annular surface 12 of the substrate support 3.

Prior to the wafer treatment, an untreated wafer W is held by the substrate support 3. More specifically, the wafer W is accommodated in the accommodation recess 13 of the substrate support 3, and then the suction valve 36 is opened with the relief valve 39 kept closed. Thus, the lower surface (device formation surface) of the wafer W is held by suction.

For the wafer treatment, the substrate support 3 which holds the untreated wafer W is transported into the treatment chamber 2 by a transport robot (not shown), and transferred to the spin chuck (Step S1). At this time, the hydrofluoric/nitric acid nozzle 5 is located at a retracted position on a lateral side of the spin chuck 4. Further, the hydrofluoric/nitric acid valve 18 and the DIW valve 20 are controlled to be closed.

After the transfer of the substrate support 3 to the spin chuck 4, the controller 50 drives the rotative drive mechanism 7 to rotate the spin chuck 4 at a lower constant rotation speed (e.g., 50 rpm). Further, the controller 50 drives the nozzle drive mechanism 16 to guide the hydrofluoric/nitric acid nozzle 5 to above the wafer W.

When the hydrofluoric/nitric acid nozzle 5 reaches above the wafer W, the controller 50 opens the hydrofluoric/nitric acid valve 18 to spout hydrofluoric/nitric acid from the hydrofluoric/nitric acid nozzle 5. Further, the controller 50 drives the nozzle drive mechanism 16 to reciprocally move (or scan) the hydrofluoric/nitric acid nozzle 5 between a position above a proximal position T1 adjacent to the rotation center C of the upper surface of the wafer W (a position T1 defined such that the applied hydrofluoric/nitric acid spreads on the wafer W to flow over the rotation center C) and a position above an off-substrate position T2 defined on the first annular surface 12 of the substrate support 3 (Step S2: etching treatment).

More specifically, the hydrofluoric/nitric acid nozzle 5 is moved radially of the wafer W. At this time, a hydrofluoric/nitric acid application point P at which hydrofluoric/nitric acid is applied from the hydrofluoric/nitric acid nozzle 5 on the upper surface of the wafer W is moved at a constant speed along an arcuate (generally linear) path extending through the rotation center C of the wafer W from the proximal position T1 to the off-substrate position T2. The proximal position T1 is spaced a distance L1 from the rotation center C. The off-substrate position T2 is spaced a distance L2 greater than the radius of the wafer W from the rotation center C of the wafer W. Where the wafer W to be treated has an outer diameter of 200 mm, the distances L1 and L2 are, for example, about 22.5 mm and about 108 mm, respectively.

When the hydrofluoric/nitric acid application point P reaches the off-substrate position T2 on the substrate support 3 by the pivoting of the arm 14, the controller 50 drives the nozzle drive mechanism 16 to pivot the arm 14 at a constant speed to move the hydrofluoric/nitric acid nozzle 5 back to the position above the proximal position T1 on the upper surface of the wafer W with the hydrofluoric/nitric acid valve 18 kept open. Thus, the hydrofluoric/nitric acid application point P reciprocally scans over the upper surface of the wafer W held by the substrate support 3. A time period required for the hydrofluoric/nitric acid application point P to move from the proximal position T1 on the wafer W to the off-substrate position T2 on the substrate support 3 and then back to the proximal position T1 is, for example, about 1.5 seconds. Thereafter, the reciprocal scanning of the hydrofluoric/nitric acid application point P is repeated for a predetermined treatment period. During the reciprocal scanning, hydrofluoric/nitric acid is spouted at a constant rate (e.g., 0.85 L/min) from the hydrofluoric/nitric acid nozzle 5.

During the etching treatment, hydrofluoric/nitric acid supplied onto the upper surface of the wafer W receives a centrifugal force generated by the rotation of the wafer W to move from the upper surface of the wafer W onto the first annular surface 12 of the substrate support 3. Where the wafer W is a silicon wafer, for example, the back surface (upper surface) of the wafer W has lower affinity for hydrofluoric/nitric acid (or is hydrophobic). On the other hand, the first annular surface 12 of the substrate support 3 has higher affinity for hydrofluoric/nitric acid (or is hydrophilic). Therefore, hydrofluoric/nitric acid smoothly moves from the upper surface of the wafer W onto the first annular surface 12 of the substrate support 3. Thus, hydrofluoric/nitric acid supplied onto the wafer W forms a liquid film continuously extending from the upper surface of the wafer W to the first annular surface 12 of the substrate support 3. Therefore, hydrofluoric/nitric acid supplied onto the upper surface of the wafer W smoothly moves to the first annular surface 12 of the substrate support 3 without formation of a substantial puddle of hydrofluoric/nitric acid on the peripheral portion of the wafer W.

After the etching treatment is performed for a predetermined period (e.g., 300 seconds), the controller 50 closes the hydrofluoric/nitric acid valve 18 to stop the spouting of hydrofluoric/nitric acid from the hydrofluoric/nitric acid nozzle 5. Further, the controller 50 drives the nozzle drive mechanism 16 to retract the hydrofluoric/nitric acid nozzle 5 to the retracted position on the lateral side of the spin chuck 4.

In turn, the controller 50 controls the rotative drive mechanism 7 to accelerate the spin chuck 4 to a predetermined rinsing rotation speed (about 100 rpm), and opens the DIW valve 20 to supply DIW from the DIW nozzle 6 toward the rotation center of the upper surface of the rotating wafer W (Step S3). Thus, a rinsing process is performed on the wafer W to wash away hydrofluoric/nitric acid from the wafer W. During the rinsing process, DIW is spouted, for example, at a rate of 2.0 L/min from the DIW nozzle 6.

After the rinsing process is performed for a predetermined period (e.g., 60 seconds), the controller 50 closes the DIW valve 20 to complete the rinsing process. Further, the controller 50 controls the rotative drive mechanism 7 to accelerate the spin chuck 4 to a predetermined drying rotation speed (about 1000 to about 2000 rpm). Thus, a spin-drying process is performed on the wafer W to spin out DIW from the upper surface of the wafer W by a centrifugal force (Step S4).

After the spin-drying process is performed for a predetermined period (e.g., 30 seconds), the controller 50 controls the rotative drive mechanism 7 to stop the rotation of the spin chuck 4. Thereafter, the treated wafer W is transported together with the substrate support 3 out of the treatment chamber 2 by the transport robot (Step S5).

Then, the first air supply pipe 38 of the substrate support 3 is connected to the second air supply pipe 40, and the vacuum is relieved in the space 41 defined between the bottom 28 of the substrate support 3 and the wafer W by opening the relief valve 39 and the switch valve 42. Thus, the wafer W is released from the suction holding, so that the wafer W can be detached from the substrate support 3. Of course, the wafer W may be released from the suction holding simply by opening the relief valve 39 to supply atmospheric air into the space 41 defined between the bottom 28 of the substrate support 3 and the wafer W without connecting the first air supply pipe 38 to the air supply pipe 40.

Next, inventive examples and a comparative example will be described.

An etching test was performed to etch an upper surface (back surface) of a rotating wafer (silicon wafer) W having an outer diameter of 200 mm for thinning the wafer W by supplying hydrofluoric/nitric acid from the hydrofluoric/nitric acid nozzle 5 having a scan nozzle form as shown in FIG. 1.

In the etching test, the hydrofluoric/nitric acid application point P at which hydrofluoric/nitric acid was applied from the hydrofluoric/nitric acid nozzle 5 was reciprocally scanned along the aforementioned arcuate path as shown in FIG. 5 between the proximal position T1 spaced 22.5 mm from the rotation center C and the off-substrate position T2 located radially outward of the peripheral edge of the wafer W and spaced 108 mm from the rotation center C. Hydrofluoric/nitric acid, which was prepared by mixing nitric acid and hydrofluoric acid in a volume ratio of 5:1, was spouted at a flow rate of 0.85 L/min from the hydrofluoric/nitric acid nozzle 5 to the wafer W. During the etching treatment, the hydrofluoric/nitric acid nozzle 5 was moved, for example, at a movement speed of 160 mm/sec, and the wafer W was rotated at a rotation speed of 52 rpm. The etching treatment period was 300 seconds. Then, an in-plane distribution of the etching rate of the wafer W (a relationship between the radial position and the etching rate) was determined. The peripheral portion of the upper surface of the wafer W was visually checked for presence of a puddle of hydrofluoric/nitric acid.

In Example 1, the etching treatment was performed with the use of the substrate treatment apparatus 1 of FIG. 1.

In Example 2, the etching treatment was performed with the use of a substrate treatment apparatus including a substrate support having a first annular surface 12 not subjected to a sandblast process (surface roughening process) instead of the substrate support 3 of the substrate treatment apparatus 1 of FIG. 1.

In Comparative Example, the substrate support 3 was not used, but a spin chuck having a size such as to be able to hold the wafer W was used for holding the wafer W.

As a result of the etching test, a variation in etching rate (a difference between the maximum etching rate and the minimum etching rate) was 4 μm/min in Example 1, 6 μm/min in Example 2, and 8 μm/min in Comparative Example.

Further, etching uniformity as expressed by the following expression was determined. The etching uniformity was 12.6% in Example 1, 12.7% in Example 2, and 19.4% in Comparative Example.

$$\text{Etching uniformity}(\%) = \frac{(\text{Maximum etching rate} - \text{Minimum etching rate}) \times 100}{2 \times \text{Average etching rate}}$$

As a result of the visual observation during the etching treatment, the puddle of hydrofluoric/nitric acid present on the peripheral portion of the wafer W had the smallest size in Example 1.

As can be understood from the above, the in-plane uniformity of the etching treatment was satisfactory in Examples 1 and 2. In Example 1, the in-plane uniformity of the etching treatment was particularly excellent.

According to this embodiment, hydrofluoric/nitric acid supplied onto the upper surface of the wafer W spreads over the upper surface of the wafer W and the first annular surface 12 of the substrate support 3 to form the liquid film over the upper surface of the wafer W and the first annular surface 12 of the substrate support 3. At this time, hydrofluoric/nitric acid present on the upper surface of the wafer W and hydrofluoric/nitric acid present on the first annular surface 12 of the substrate support 3 are continuous in the form of the liquid film. Therefore, the liquid film of hydrofluoric/nitric acid is formed as having a generally uniform and smaller thickness over the entire upper surface of the wafer W. Therefore, even if the wafer W is rotated at a lower rotation speed, it is possible to prevent or suppress the formation of the puddle of hydrofluoric/nitric acid on the peripheral portion of the upper surface of the wafer W, so that the peripheral portion and the center portion of the upper surface of the wafer W are etched at substantially the same etching rate. Thus, the etching treatment can be uniformly performed on the major surface of the wafer W.

Figure 6A:
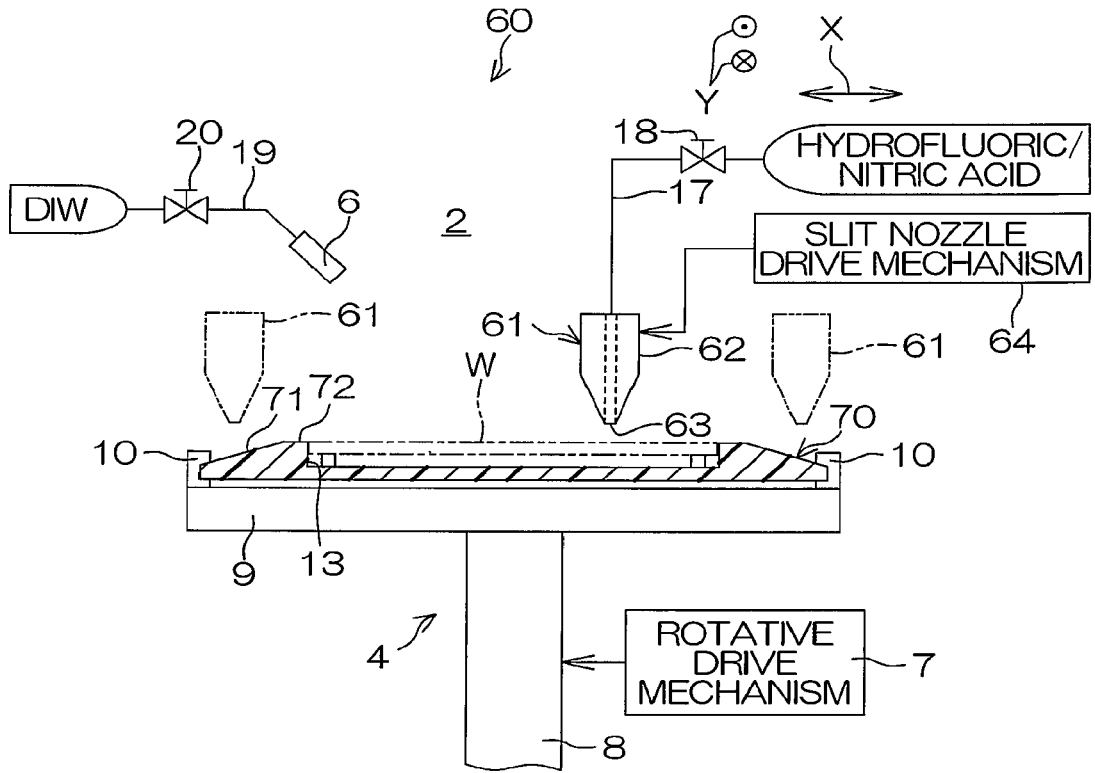
FIG. 6A is a sectional view schematically showing the construction of a substrate treatment apparatus according to a second embodiment of the present invention.
Figure 6B:
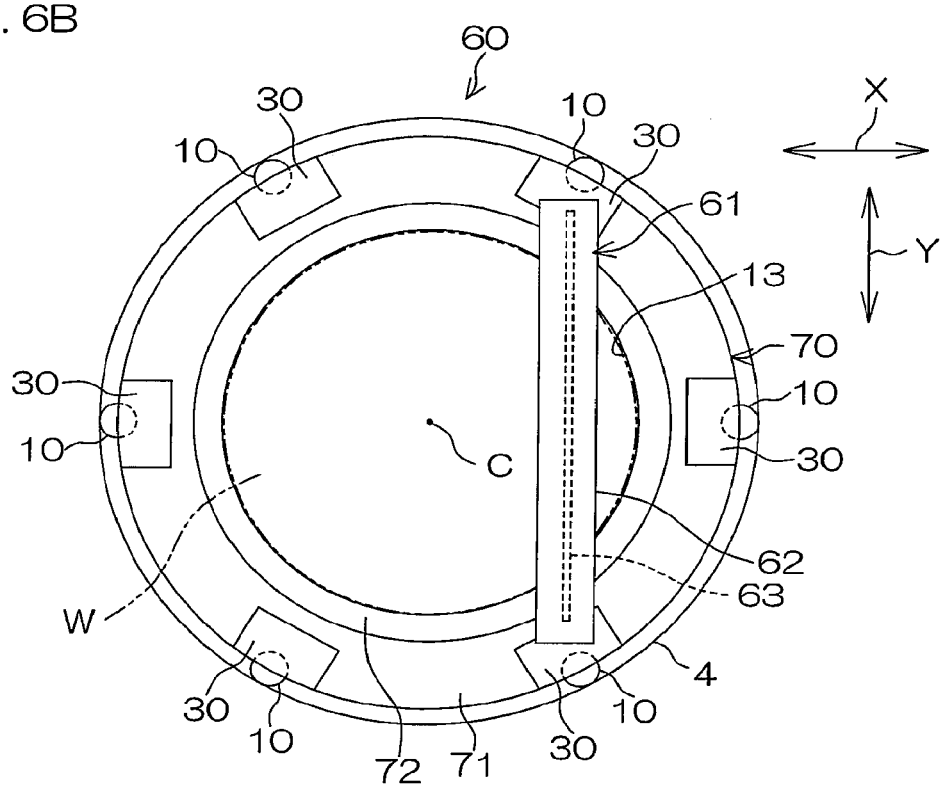
FIG. 6B is a plan view schematically showing the construction of the substrate treatment apparatus shown in FIG. 6A.

FIG. 6A is a sectional view schematically showing the construction of a substrate treatment apparatus 60 according to another embodiment (second embodiment) of the present invention. FIG. 6B is a plan view schematically showing the construction of the substrate treatment apparatus 60 shown in FIG. 6A. In the second embodiment, components corresponding to those in the first embodiment will be denoted by the same reference characters as in the first embodiment, and duplicate description will be omitted.

In the second embodiment, a slit nozzle (etching liquid supply mechanism) 61 which spouts hydrofluoric/nitric acid in the form of an elongated profile stream is used instead of the straight nozzle provided as the hydrofluoric/nitric acid nozzle 5.

In this embodiment, a substrate support 70 including a taper surface 71 on its upper surface is employed instead of the substrate support 3 shown in FIGS. 2A and 2B. In other words, the substrate holding mechanism consists of the substrate support 70 and spin chuck 4.

The slit nozzle 61 includes a slit spout 63 which is an opening linearly extending along a predefined Y-axis and opposed to the upper surface of the wafer W held by the substrate support 70. The slit nozzle 61 is supported slidably along an X-axis perpendicular to the Y-axis by a support rail (not shown). The X-axis and the Y-axis extend parallel to the upper surface of the wafer W (horizontally). A slit nozzle drive mechanism 64 is connected to the slit nozzle 61. The slit nozzle 61 is slidable along the X-axis by a drive force of the slit nozzle drive mechanism 64. The hydrofluoric/nitric acid supply pipe 17 is connected to the slit nozzle 61 for supplying hydrofluoric/nitric acid from a hydrofluoric/nitric acid supply source.

The upper surface of the substrate support 70 includes a second flat annular surface (extension surface) 72 surrounding an accommodation recess 13, and an annular taper surface 71 continuously extending from the second annular surface 72 radially outward of the wafer W as surrounding the second annular surface 72. The second annular surface 72 has been subjected to a hydrophilizing process such as a sand blast process (surface roughening process). The taper surface 71 has a height that progressively decreases in a direction extending radially outward of the wafer W. The taper surface 71 may be subjected to the hydrophilizing process (e.g., the sand blast process) or not subjected to the hydrophilizing process.

The second annular surface 72 has substantially the same geometry as the first annular surface 12 of the substrate support 3 in the first embodiment, except that the second annular surface 72 has a smaller width than the first annular surface 12. The other structure of the substrate support 70 is substantially the same as the substrate support 3 in the first embodiment.

Figure 7:
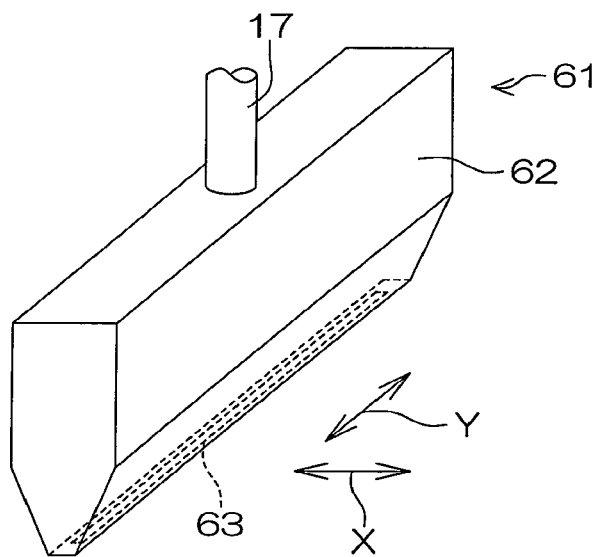
FIG. 7 is a perspective view showing the structure of a slit nozzle of the substrate treatment apparatus shown in FIG. 6A.

FIG. 7 is a perspective view showing the structure of the slit nozzle 61.

The slit nozzle 61 includes a nozzle body 62 having a generally rectangular solid outer shape elongated along the Y-axis. The sectional shape of the nozzle body 62 taken along the X-axis is tapered downward. The slit spout 63 is provided in a lower end surface of the nozzle body 62. The length of the slit spout 63 as measured along the Y-axis is greater than the diameter of the wafer W. The slit spout 63 has an opening width of, for example, about 0.5 mm.

Hydrofluoric/nitric acid is spouted from the slit spout 63 in the form of a stream having a profile elongated along the Y-axis.

Figure 8:
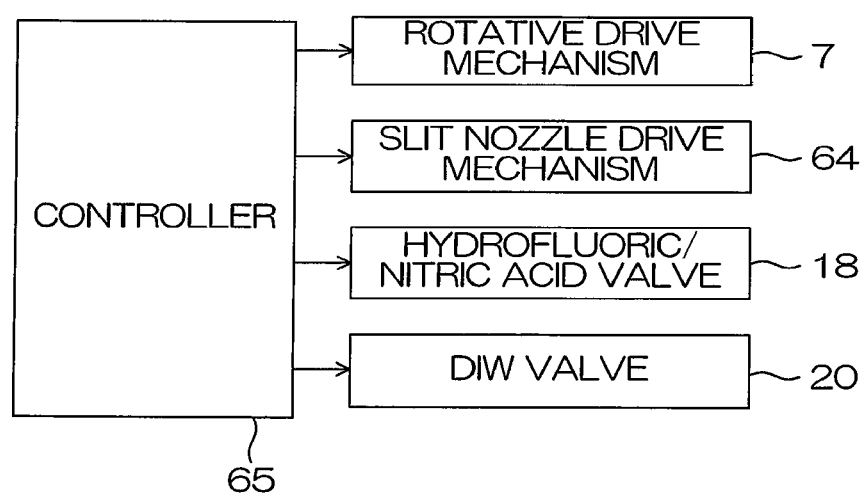
FIG. 8 is a block diagram showing the electrical construction of the substrate treatment apparatus shown in FIG. 6A.

FIG. 8 is a block diagram showing the electrical construction of the substrate treatment apparatus 60.

The substrate treatment apparatus 60 includes a controller 65 including a microcomputer. The rotative drive mechanism 7, the slit nozzle drive mechanism 64, the hydrofluoric/nitric acid valve 18, the DIW valve 20 and the like are connected as control objects to the controller 65.

Referring to FIGS. 6A and 6B, an exemplary wafer treatment will be described.

Prior to the wafer treatment, an untreated wafer W is held by the substrate support 70.

For the wafer treatment, the substrate support 70 which holds the untreated wafer W is transported into the treatment chamber 2 by the transport robot (not shown), and transferred to the spin chuck 4.

After the transfer of the substrate support 70 to the spin chuck 4, the controller 65 drives the rotative drive mechanism 7 to rotate the spin chuck 4 at a very low constant rotation speed (e.g., 5 rpm). Further, the controller 65 drives the slit nozzle drive mechanism 64 to guide the slit nozzle 61 to above the wafer W.

When the slit nozzle 61 reaches above the wafer W, the controller 65 opens the hydrofluoric/nitric acid valve 18 to spout hydrofluoric/nitric acid from the slit spout 63 in the form of a stream having a profile elongated along the Y-axis. Further, the controller 65 drives the slit nozzle drive mechanism 64 to reciprocally move (or scan) the slit nozzle 61 along the X-axis between a scan start position above the taper surface 71 of the substrate support 70 (as indicated by a two-dot-and-dash line on a right side in FIG. 6A) and a return position located diametrically opposite from the scan start position about the rotation center of the wafer W above the taper surface 71 of the substrate support 70 (as indicated by a two-dot-and-dash line on a left side in FIG. 6A). During the reciprocal movement, hydrofluoric/nitric acid is spouted at a constant flow rate (e.g., 1.5 L/min) from the slit nozzle 61.

The slit nozzle 61, which spouts hydrofluoric/nitric acid in the form of the elongated profile stream, is capable of supplying hydrofluoric/nitric acid at a greater flow rate onto the upper surface of the wafer W than the straight nozzle. Since the rotation speed of the wafer W is very low (e.g., 5 rpm), the centrifugal force hardly acts on the hydrofluoric/nitric acid present on the upper surface of the wafer W due to the rotation of the wafer W. Therefore, the hydrofluoric/nitric acid is liable to remain on the wafer W.

Where the wafer W is a silicon wafer, the back surface (upper surface) of the wafer W has lower affinity for hydrofluoric/nitric acid (or is hydrophobic). On the other hand, the second annular surface 72 of the substrate support 70 has higher affinity for hydrofluoric/nitric acid (or is hydrophilic). Therefore, hydrofluoric/nitric acid smoothly moves from the upper surface of the wafer W onto the second annular surface 72 of the substrate support 70. Since the taper surface 71 extends continuously from the second annular surface 72 radially outward of the wafer W, hydrofluoric/nitric acid flows at a higher flow rate (radially outward of the wafer W) on the second annular surface 72. Therefore, the movement of hydrofluoric/nitric acid from the upper surface of the wafer W to the second annular surface 72 of the substrate support 70 is further promoted. As a result, the liquid film of hydrofluoric/nitric acid formed on the upper surface of the wafer W has a reduced thickness.

After the etching treatment is performed for a predetermined period (e.g., 300 seconds), the controller 65 closes the hydrofluoric/nitric acid valve 18 to stop the spouting of hydrofluoric/nitric acid from the slit nozzle 61. Further, the controller 65 drives the slit nozzle drive mechanism 64 to retract the slit nozzle 61 to the retracted position on the lateral side of the spin chuck 4.

Thereafter, the rinsing process (see Step S3 in FIG. 4) and the spin-drying process (see Step S4 in FIG. 4) are performed on the wafer W. After the spin-drying process, the controller 65 controls the rotative drive mechanism 7 to stop the rotation of the spin chuck 4. Thereafter, the treated wafer W is transported together with the substrate support 70 out of the treatment chamber 2 by the substrate transport robot.

According to the second embodiment described above, hydrofluoric/nitric acid supplied onto the upper surface of the wafer W spreads over the upper surface of the wafer W and the second annular surface 72 of the substrate support 70 to form the liquid film over the upper surface of the wafer W and the second annular surface 72 of the substrate support 70. At this time, hydrofluoric/nitric acid present on the upper surface of the wafer W and hydrofluoric/nitric acid present on the second annular surface 72 of the substrate support 70 are continuous in the form of the liquid film. Therefore, even if the wafer W is rotated at a very low rotation speed, the movement of hydrofluoric/nitric acid from the upper surface of the wafer W to the second annular surface 72 of the substrate support 70 is promoted. This prevents or suppresses the formation of a thicker liquid film of hydrofluoric/nitric acid over the upper surface of the wafer W. Thus, the etching treatment can be performed at a higher etching rate on the upper surface of the wafer W with improved in-plane uniformity.

Figure 9:
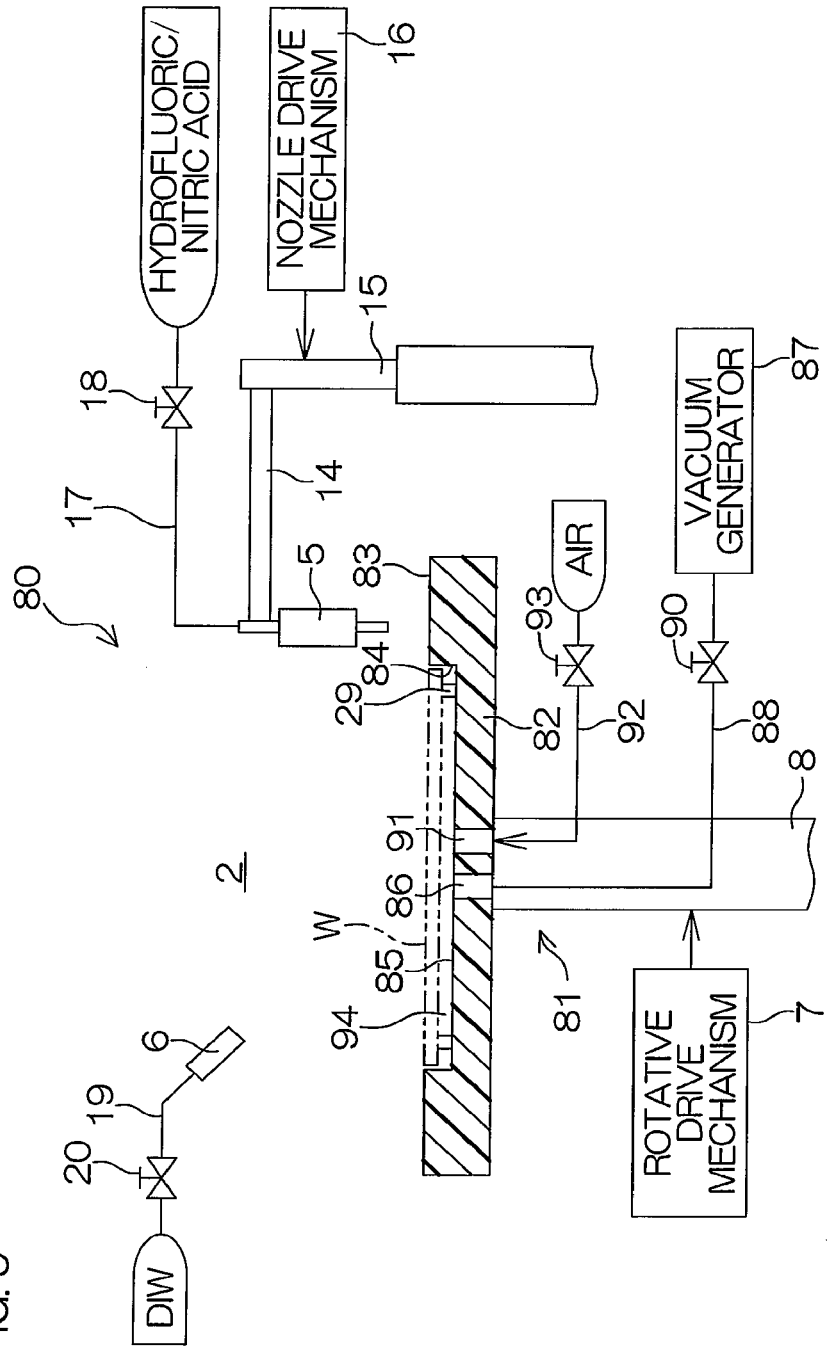
FIG. 9 is a sectional view schematically showing the construction of a substrate treatment apparatus according to a third embodiment of the present invention.

FIG. 9 is a sectional view schematically showing the construction of a substrate treatment apparatus 80 according to further another embodiment (third embodiment) of the present invention. In the third embodiment, components corresponding to those in the first embodiment will be denoted by the same reference characters as in the first embodiment, and duplicate description will be omitted.

In this embodiment, a substrate holding mechanism 81 is employed instead of the susceptor 3 and the spin chuck 4. The substrate holding mechanism 81 holds and rotates a wafer W.

The substrate holding mechanism 81 includes a disk-shaped spin base 82 fixed to an upper end of the rotation shaft 8 which is rotated about a vertical axis by the rotative drive force of the rotative drive mechanism 7. The spin base 82 is formed of a material (particularly, a resin material) such as polyvinyl chloride which is resistant to hydrofluoric/nitric acid. The spin base 82 includes a hollow cylindrical accommodation recess 84 (support member) provided in a center portion of an upper surface thereof for holding the wafer W. The upper surface of the spin base 82 includes a third flat annular surface 83 which surrounds the accommodation recess 84.

The accommodation recess 84 has a round bottom surface, and an inner peripheral surface vertically extending upright from a peripheral edge of the bottom surface. The inner peripheral surface is a cylindrical surface having substantially the same diameter as the wafer W. An annular seal member 29 serving as a support member for supporting the wafer W is provided along the peripheral edge of the bottom 85 on an upper surface (bottom surface) of the bottom 85 of the accommodation recess 84. A peripheral portion of the lower surface of the wafer W is supported by the seal member 29. The seal member 29 may be a lip packing which has a lip to be brought into line contact with the lower surface of the wafer W, or may be a surface packing which is to be brought into surface contact with the lower surface of the wafer W. Where the lip packing is used as the seal member 29, the lip packing has a sufficiently rigid proximal portion to limit its deformation and, therefore, precisely defines the height of the upper surface of the supported wafer W.

The third annular surface 83 of the spin base 82 is a flat surface extending outward from an upper edge of the inner peripheral surface of the accommodation recess 84. With the wafer W being supported by the spin base 82, the third annular surface 83 is parallel to the upper surface of the wafer W. With the wafer W being held by the spin base 82, the third annular surface 83 is located at a height level such that hydrofluoric/nitric acid present on the upper surface of the wafer W held in the accommodation recess 84 and hydrofluoric/nitric acid present on the third annular surface 83 form a continuous liquid film. More specifically, the third annular surface 83 is horizontally located at a height level that is lower than the upper surface of the wafer W (the wafer W subjected to the etching treatment) held in the accommodation recess 84. The height level of the third annular surface 83 of the spin base 82 is such that a level difference defined between the third annular surface 83 and the upper surface of the wafer W is, for example, about 200 μm before the etching treatment and is about 40 μm after the etching treatment. With the wafer W being held by the spin base 82, the third annular surface 83 serves as an extension surface extending continuously to the upper surface of the wafer W. The third annular surface 83 is substantially equivalent to an extension surface provided by virtually expanding the upper surface of the wafer W to cause the liquid to flow outward from the upper surface of the wafer W.

The third annular surface 83 of the spin base 82 has been subjected to a hydrophilizing process so as to be imparted with higher affinity for hydrofluoric/nitric acid (hydrophilic property). The hydrophilizing process may be, for example, a sandblast process (surface roughening process). The hydrophilizing process causes the third annular surface 83 of the spin base 82 to have higher affinity for hydrofluoric/nitric acid than the upper surface (back surface) of the wafer W.

The accommodation recess 84 has a suction port 86 formed in the bottom 85 thereof. A suction pipe 88 is connected to the suction port 86 at one end thereof. The other end of the suction pipe 88 is connected to a vacuum generator 87 which serves as a suction mechanism. A suction valve 90 is provided in the suction pipe 88 for switchably opening and closing the suction pipe 88.

The accommodation recess 84 further has a vacuum relief port 91 formed in the bottom 85 thereof. A third air supply pipe 92 is connected to the relief port 91 at one end thereof. The third air supply pipe 92 is connected to an air supply source, so that air can be supplied to the relief port 91 from the air supply source through the third air supply pipe 92. A relief valve 93 for opening and closing the third air supply pipe 92 is provided in the third air supply pipe 92.

When the relief valve 93 is closed and the suction valve 90 is opened with the vacuum generator 87 being active and with the wafer W being accommodated in the accommodation recess 84, air is sucked from a space 94 defined between the bottom 85 and the wafer W. Thus, the internal pressure of the space 84 is reduced to a negative level, whereby the lower surface (device formation surface) of the wafer W is held by suction. With the wafer W being held by suction, the peripheral portion of the lower surface of the wafer W is kept in intimate contact with an upper portion of the seal member 29, whereby hydrofluoric/nitric acid is prevented from intruding into the lower surface (device formation region) of the wafer W.

When the relief valve 93 is opened with the wafer W being held on the spin base 82 by suction, air is supplied into the space 94 defined between the bottom 85 and the wafer W, and the vacuum is relieved in the space 94. Thus, the wafer W is released from the suction holding, so that the wafer W can be detached from the spin base 82.

Figure 10:
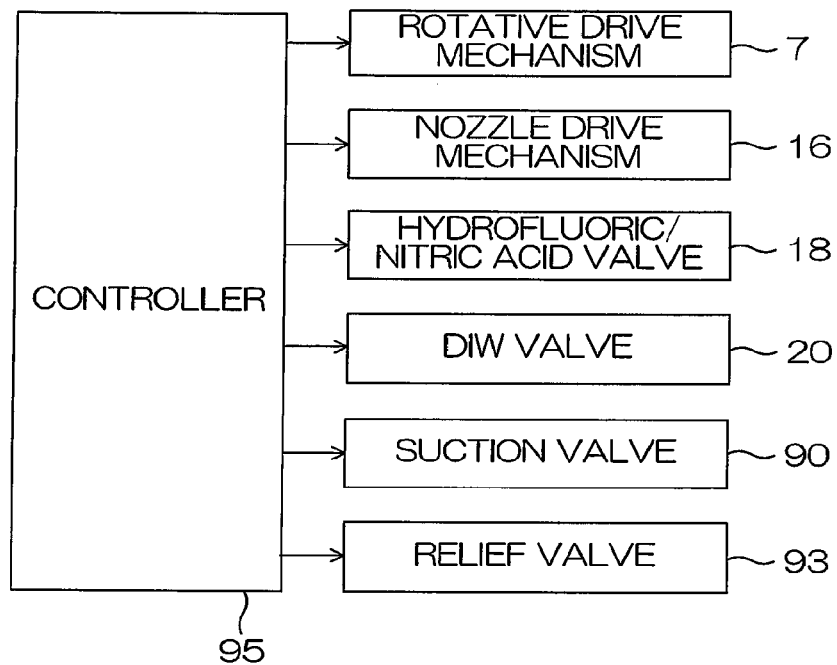
FIG. 10 is a block diagram showing the electrical construction of the substrate treatment apparatus shown in FIG. 9.

FIG. 10 is a block diagram showing the electrical construction of the substrate treatment apparatus 80.

The substrate treatment apparatus 80 includes a controller 95 including a microcomputer. The rotative drive mechanism 7, the nozzle drive mechanism 16, the hydrofluoric/nitric acid valve 18, the DIW valve 20, the suction valve 90, the relief valve 93 and the like are connected as control objects to the controller 95.

Figure 11:
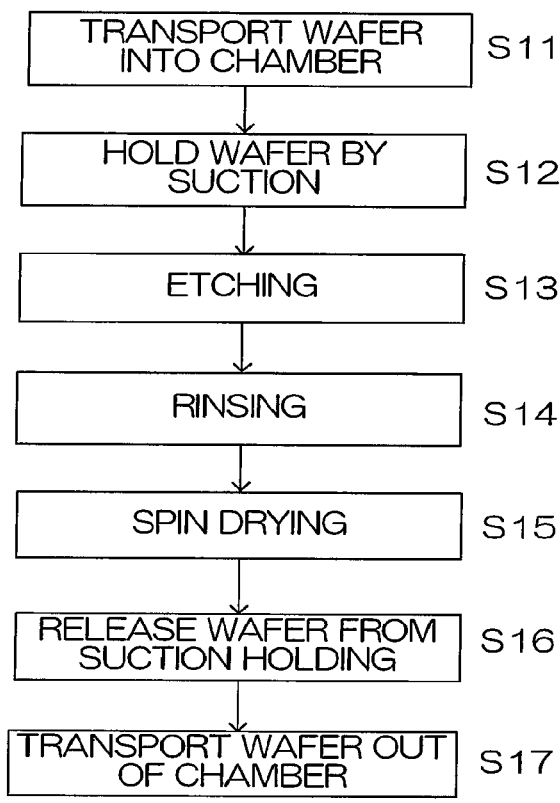
FIG. 11 is a flowchart showing an exemplary wafer treatment to be performed by the substrate treatment apparatus shown in FIG. 9.

FIG. 11 is a flow chart showing an exemplary wafer treatment to be performed by the substrate treatment apparatus 80.

For the wafer treatment, an untreated wafer W is transported into the treatment chamber 2 by the transport robot (not shown) and transferred to the spin base 82 of the substrate holding mechanism 81 (Step S11). At this time, the hydrofluoric/nitric acid nozzle 5 is located at the retracted position on the lateral side of the substrate holding mechanism 81. Further, the hydrofluoric/nitric acid valve 18, the DIW valve 20, the suction valve 90 and the relief valve 93 are controlled to be closed.

After the transfer of the wafer W to the spin base 82, the controller 95 opens the suction valve 90. Thus, the wafer W is held on the spin base 82 by suction (Step S12).

After the transfer of the wafer W to the spin base 82, an etching treatment, a rinsing process and a spin-drying process are performed on the wafer W in Steps S13, S14 and S15, respectively. The etching treatment in Step S13 is equivalent to the etching treatment in Step S2 in FIG. 4, and the rinsing process in Step S14 is equivalent to the rinsing process in Step S3 in FIG. 4. The spin-drying process in Step S15 is equivalent to the spin-drying process in Step S4 in FIG. 4. After the spin-drying, the controller 95 controls the rotative drive mechanism 7 to stop the rotation of the spin base 82.

Thereafter, the controller 95 opens the relief valve 93, whereby the vacuum is relieved in the space 94 defined between the bottom 85 of the spin base 82 and the wafer W. Thus, the wafer W is released from the suction holding (Step S16), so that the wafer W can be detached from the spin base 82.

Then, the treated wafer W is transported out of the treatment chamber 2 by the substrate transport robot (Step S17).

Figure 12:
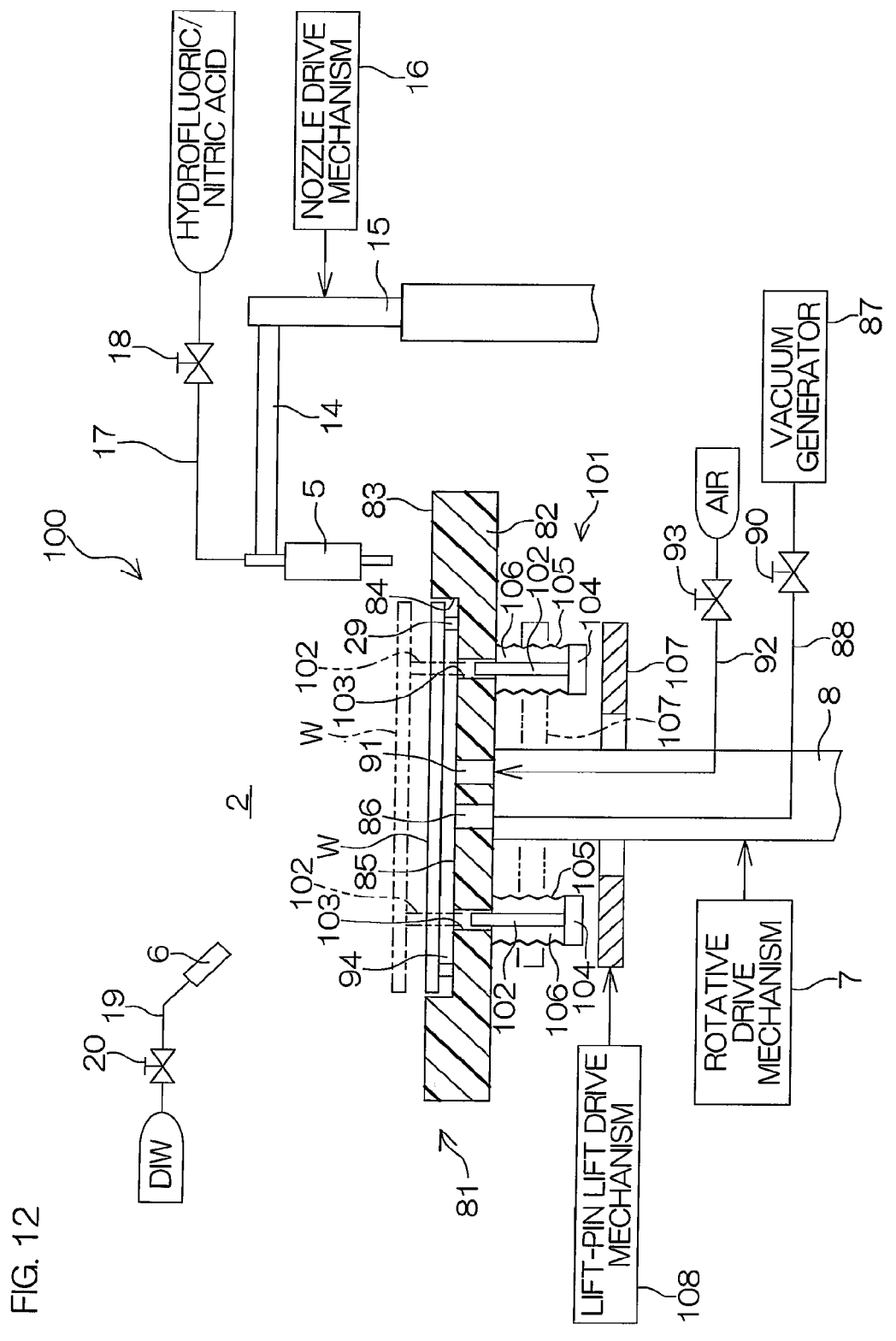

FIG. 12 is a sectional view schematically showing the construction of a substrate treatment apparatus 100 according to still another embodiment (fourth embodiment) of the present invention. In the fourth embodiment, components corresponding to those in the third embodiment will be denoted by the same reference characters as in the third embodiment, and duplicate description will be omitted.

The fourth embodiment differs from the third embodiment in that a substrate lift mechanism 101 is provided for moving up and down the wafer W held by the substrate holding mechanism 81. The substrate lift mechanism 101 moves up and down the wafer W between a position at which the wafer W is accommodated in the accommodation recess 84 and a position at which the wafer W is removed upward from the accommodation recess 84.

The substrate lift mechanism 101 includes a plurality of lift pins 102 (e.g., four lift pins 102, but only two lift pins 102 are shown in FIG. 12) for moving up and down the wafer W with respect with the spin base 82. The lift pins 102 are respectively inserted in through-holes 103 vertically extending through the spin base 82, and movable up and down with respect to the spin base 82. Lower ends of the lift pins 102 are respectively fixed to disk-shaped support plates 104. Hollow cylindrical bellows 105 extending downward from a lower surface of the spin base 82 are respectively connected to the support plates 104.

The bellows 105 are composed of a resin (e.g., polyvinyl chloride) resistant to hydrofluoric/nitric acid for stretchability, and respectively surround the lift pins 102. Upper ends of the bellows 105 are connected in intimate contact with the lower surface of the spin base 82 as respectively surrounding openings of the through-holes 103. The lower ends of the bellows 105 are respectively connected in intimate contact with the entire peripheries of the support plates 104. Spaces 106 each defined by the bellows 105 and the support plate 104 communicate with the outside only through the corresponding through-holes 103. Therefore, with the wafer W being accommodated in the accommodation recess 84, the space 94 and the spaces 106 are entirely closed.

An annular plate-shaped support ring 107 is disposed below the spin base 82 as surrounding the rotation shaft 8. The support ring 107 is not supported by the rotation shaft 8, but supported by other member, e.g., by a frame (not shown) in which the entire treatment chamber 2 is provided. Therefore, the support ring 107 is not rotated together with the rotation shaft 8. A lift-pin lift drive mechanism 108 is connected to the support ring 107. The lift pins 102 are collectively moved up and down by the lift-pin lift drive mechanism 108 between a projecting position (indicated by a two-dot-and-dash line in FIG. 12) at which the distal ends of the lift pins 102 project above the third annular surface 83 of the spin base 82 and a retracted position (indicated by a solid line in FIG. 12) at which the distal ends of the lift pins 102 are retracted below the upper surface of the bottom 85 of the spin base 82. The lift-pin lift drive mechanism 108 is connected as a control object to the controller (see FIG. 10).

With the lift pins 102 being located at the retracted position, the support plates 104 and the lift pins 102 are suspended by the corresponding bellows 105. Lower surfaces of the support plates 104 do not contact the upper surface of the support ring 107, so that the lift pins 102 are supported only by the spin base 82. The bellows 105 are stretched from a non-restricted state by the weights of the lift pins 102 and the support plates 104.

When the support ring 107 is moved up from a state indicated by a solid line in FIG. 12 by driving the lift-pin lift drive mechanism 108, the upper surface of the support ring 107 is brought into abutment engagement with the lower surfaces of the support plates 104. With the support plates 104 in engagement with the support ring 107, the lift pins 102 are supported by the support ring 107. When the support ring 107 is further moved up, the lift pins 102 and the support plates 104 are moved up, whereby the bellows 105 are contracted.

With the lift pins 102 being located at the projecting position, on the other hand, the wafer W is removed upward from the accommodation recess 84. Thus, the transport robot (not shown) can access the wafer W so as to lift the wafer W from below by its hands (not shown).

When the support ring 107 is moved down from a state indicated by a two-dot-and-dash line in FIG. 12 by driving the lift-pin lift drive mechanism 108, the lift pins 102 and the support plates 104 are moved down. Thus, the bellows 105 are stretched by the downward movement. When the support ring 107 is further moved down, the support plates 104 are brought out of engagement with the support ring 107. Thus, the lift pins 102 are disengaged from the support ring 107 and, therefore, supported by the bellows 105.

Next, an exemplary wafer treatment to be performed by the substrate treatment apparatus 100 according to the fourth embodiment will be described.

For the wafer treatment, the controller 95 drives the lift-pin lift drive mechanism 108 to move up the lift pins 102 to the projecting position before an untreated wafer W is transported into the treatment chamber 2 (before Step S11 in FIG. 11). Thereafter, the untreated wafer W is transported into the treatment chamber 2 by the transport robot (not shown), and rested on the lift pins 102. Then, the controller 95 drives the lift-pin lift drive mechanism 108 to move the lift pins 102 down to the retracted position. Thus, the wafer W is accommodated in the accommodation recess 84. In this manner, the wafer W is transferred to the spin base 82 (a step corresponding to Step S11 in FIG. 11).

When the controller 95 closes the relief valve 93 and opens the suction valve 90 with the vacuum generator 87 being active, air is sucked from the space 94 and the spaces 106. Since the space 94 and the spaces 106 are closed at this time, the internal pressures of these spaces 94, 106 are each reduced to a negative level. Thus, the lower surface (device formation surface) of the wafer W is held by suction (a step corresponding to Step S12 in FIG. 11).

The bellows 105 are each allowed to have a smaller contraction per unit stress by proper material selection and geometric design. Therefore, the bellows 105 are hardly contracted by the air suction for the suction-holding of the wafer W, so that the lift pins 102 are hardly lifted.

In turn, a series of processes (corresponding to Steps S13 to S15 in FIG. 11) are performed on the wafer W. After the completion of the series of processes, the controller 95 opens the relief valve 93, whereby the vacuum is relieved in the space 94 and the spaces 106. Thus, the wafer W is released from the suction holding (a step corresponding to Step S16 in FIG. 11).

Then, the controller 95 drives the lift-pin lift drive mechanism 108 to move the lift pins 102 up to the projecting position. Thus, the treated wafer W is removed upward from the accommodation recess 84.

Thereafter, the treated wafer W is transported out of the treatment chamber 2 by the substrate transport robot (a step corresponding to Step S17 in FIG. 11).

While the four embodiments of the present invention have thus been described, the invention may be embodied in other ways.

In the second embodiment, the slit nozzle 61 is reciprocally moved horizontally along the X-axis. Alternatively, the slit nozzle 61 may be attached to a generally horizontally extending arm, and adapted to be moved above the wafer W by pivoting the arm.

In the first, third and fourth embodiments, the hydrofluoric/nitric acid application point P at which hydrofluoric/nitric acid is applied from the hydrofluoric/nitric acid nozzle 5 is reciprocally scanned outward beyond a peripheral surface of the wafer W, but may be reciprocally scanned within the surface of the wafer W.

In the first to fourth embodiments, the hydrofluoric/nitric acid nozzle 5 and the slit nozzle 61 are adapted to be reciprocally moved by way of example, but may be each adapted to scan in one direction. That is, when the nozzle 5, 61 is reciprocally moved, the spouting of hydrofluoric/nitric acid may be permitted during movement of the nozzle 5, 61 in one direction, and prohibited during movement of the nozzle 5, 61 in the other direction.

In the four embodiments described above, the first to third annular surfaces 12, 72, 83 are each a flat surface parallel to the upper surface of the wafer W by way of example, but may be inclined with respect to the upper surface of the wafer W, or curved or bent.

In the four embodiments described above, the first to third annular surfaces 12, 72, 83 have been subjected to the hydrophilizing process, but the substrate support 3, 70 and the spin base 82 per se may each be formed of a material having higher affinity for hydrofluoric/nitric acid. That is, the substrate support 3, 70 and the spin base 82 may be formed of a material which is resistant to hydrofluoric/nitric acid and has higher affinity for hydrofluoric/nitric acid. Examples of such a material include polyvinyl chloride and polypropylene.

The substrate support 70 employed in the second embodiment may be used instead of the substrate support 3 for the substrate treatment apparatus 1 in the first embodiment. The substrate support 3 employed in the first embodiment may be used instead of the substrate support 70 for the substrate treatment apparatus 60 in the second embodiment.

The spin bases 82 employed in the third and fourth embodiments (see FIGS. 9 and 12) may each include a taper surface provided on an edge portion of the third annular surface 83 thereof as extending downward radially outward of the wafer W like the taper surface 71 in the second embodiment.

In the four embodiments descried above, the substrate treatment apparatuses 1, 60, 80, 100 are adapted to perform the etching treatment on the wafer W for thinning the wafer W by way of example, but may be adapted to perform the etching treatment for removing an oxide film from a device formation surface (upper or lower surface) of a disk-shaped oxide silicon wafer W. In this case, hydrofluoric acid, for example, is preferably used as the etching liquid. Where the etching treatment is performed for removing a nitride film from the wafer W, phosphoric acid may be used as the etching liquid.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2008-21776 filed in the Japanese Patent Office on Jan. 31, 2008 and No. 2008-307995 filed in the Japanese Patent Office on Dec. 2, 2008, the disclosure of which are incorporated herein by reference in its entirety.

What is claimed is:

1. A substrate treatment method comprising the steps of:
supporting a substrate with a support member;
arranging an extension surface such that the extension surface laterally surrounds one major surface of the substrate supported by the support member and extends continuously to the major surface of the substrate supported by the support member, the extension surface being provided with higher affinity for the etching liquid than the major surface of the substrate supported by the support member;
rotating the substrate supported by the support member; and
etching the substrate by supplying an etching liquid onto the major surface of the substrate supported by the support member.

2. A substrate treatment method as set forth in claim 1, wherein the etching liquid includes at least one selected from the group consisting of hydrofluoric/nitric acid, hydrofluoric acid, and phosphoric acid.

3. A substrate treatment method as set forth in claim 1, wherein
in the supporting step, the support member horizontally supports the substrate, and
in the arranging step, the extension surface is arranged such that the major surface of the substrate supported by the support member is at a higher level than the extension surface.

4. A substrate treatment method as set forth in claim 3, wherein
in the arranging step, the extension surface is arranged such that the major surface of the substrate supported by the support member is furthermore at a higher level than the extension surface after the etching step.

5. A substrate treatment method as set forth in claim 1, wherein
in the arranging step, the extension surface is arranged close to the major surface of the substrate supported by the support member such that etching liquid present on the major surface and etching liquid present on the extension surface form a continuous liquid film.

6. A substrate treatment method as set forth in claim 1, wherein
in the arranging step, the extension surface extends parallel to the major surface of the substrate supported by the support member.

7. A substrate treatment method as set forth in claim 1, wherein
in the supporting step, the support member horizontally supports the substrate, and
the method further comprises the step of arranging a taper surface having a height that progressively decreases in a direction extending radially outward of the substrate such that the taper surface extends continuously from the extension surface radially outward of the substrate.

8. A substrate treatment method as set forth in claim 1, wherein
the etching step includes the step of scanning with the etching liquid over the entire major surface of the substrate which is rotated.

9. A substrate treatment method as set forth in claim 8, wherein
the scanning step scans with the etching liquid, in addition to the entire major surface of the substrate, to a position radially outward of a peripheral portion of the substrate.

* * * * *